US012784787B2

(12) United States Patent
Morzano

(10) Patent No.: US 12,784,787 B2
(45) Date of Patent: Nov. 3, 2026

(54) SENSE AMPLIFIER BALANCING COMPONENT

(71) Applicant: Micron Technology, Inc., Boise, ID (US)

(72) Inventor: Christopher Morzano, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 125 days.

(21) Appl. No.: 18/788,948

(22) Filed: Jul. 30, 2024

(65) Prior Publication Data

US 2026/0038578 A1 Feb. 5, 2026

(51) Int. Cl.

| | |
|---|---|
| ***G11C 7/12*** | (2006.01) |
| ***G11C 7/06*** | (2006.01) |
| *G11C 11/4091* | (2006.01) |
| *G11C 11/4094* | (2006.01) |
| *G11C 11/419* | (2006.01) |

(52) U.S. Cl.

CPC .................. *G11C 7/12* (2013.01); *G11C 7/06* (2013.01); *G11C 11/4091* (2013.01); *G11C 11/4094* (2013.01); *G11C 11/419* (2013.01)

(58) Field of Classification Search

CPC ... G11C 11/4091; G11C 11/4085; G11C 7/12; G11C 7/06; G11C 11/4094; G11C 11/419

See application file for complete search history.

(56) References Cited

U.S. PATENT DOCUMENTS

| | | | | |
|---|---|---|---|---|
| 4,130,895 | A * | 12/1978 | Zibert | H10B 12/00 257/E27.084 |
| 6,108,237 | A * | 8/2000 | Briner | G11C 16/24 365/185.11 |
| 6,301,175 | B1 | 10/2001 | Seyyedy et al. | |
| 6,950,368 | B2 | 9/2005 | Morgan | |
| 7,002,862 | B2 | 2/2006 | Kang | |
| 9,042,190 | B2 | 5/2015 | Vimercati et al. | |
| 11,152,055 | B1 * | 10/2021 | Lee | G11C 11/4094 |
| 2001/0012214 | A1 * | 8/2001 | Akita | G11C 7/12 365/149 |
| 2004/0114287 | A1 * | 6/2004 | Salling | H10D 89/815 361/90 |
| 2006/0250732 | A1 * | 11/2006 | Peachey | H10D 89/711 361/56 |
| 2008/0266987 | A1 * | 10/2008 | Terzioglu | G11C 29/028 365/189.07 |
| 2008/0266992 | A1 * | 10/2008 | Terzioglu | G11C 11/4093 365/207 |
| 2010/0078695 | A1 * | 4/2010 | Law | H10D 84/212 257/296 |
| 2012/0044133 | A1 * | 2/2012 | Nakamizo | G11C 19/28 377/64 |

(Continued)

*Primary Examiner* — Jay W. Radke

(74) *Attorney, Agent, or Firm* — Brooks, Cameron & Huebsch, PLLC

(57) ABSTRACT

The present disclosure includes apparatuses and methods related to a sense amp capacitance component in memory. An example apparatus can include a sense amplifier connected to a first digit line and a second digit line and a capacitance component coupled to the first digit line and configured to, in association with sensing a memory cell connected to the second digit line, be enabled to increase a voltage of the first digit line is increased to compensate for capacitive coupling corresponding to the second digit line.

20 Claims, 7 Drawing Sheets

(56) References Cited

U.S. PATENT DOCUMENTS

| | | | | |
|---|---|---|---|---|
| 2014/0269061 | A1* | 9/2014 | Tran | G11C 7/067<br>365/185.21 |
| 2019/0156869 | A1 | 5/2019 | Ingalls et al. | |
| 2021/0020210 | A1* | 1/2021 | Lee | G11C 7/062 |

* cited by examiner

SENSE AMPLIFIER BALANCING COMPONENT

TECHNICAL FIELD

The present disclosure relates generally to memory devices, and more particularly, to apparatuses and methods for a sense amplifier ("sense amp") balancing component.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

DETAILED DESCRIPTION

Figure 1:
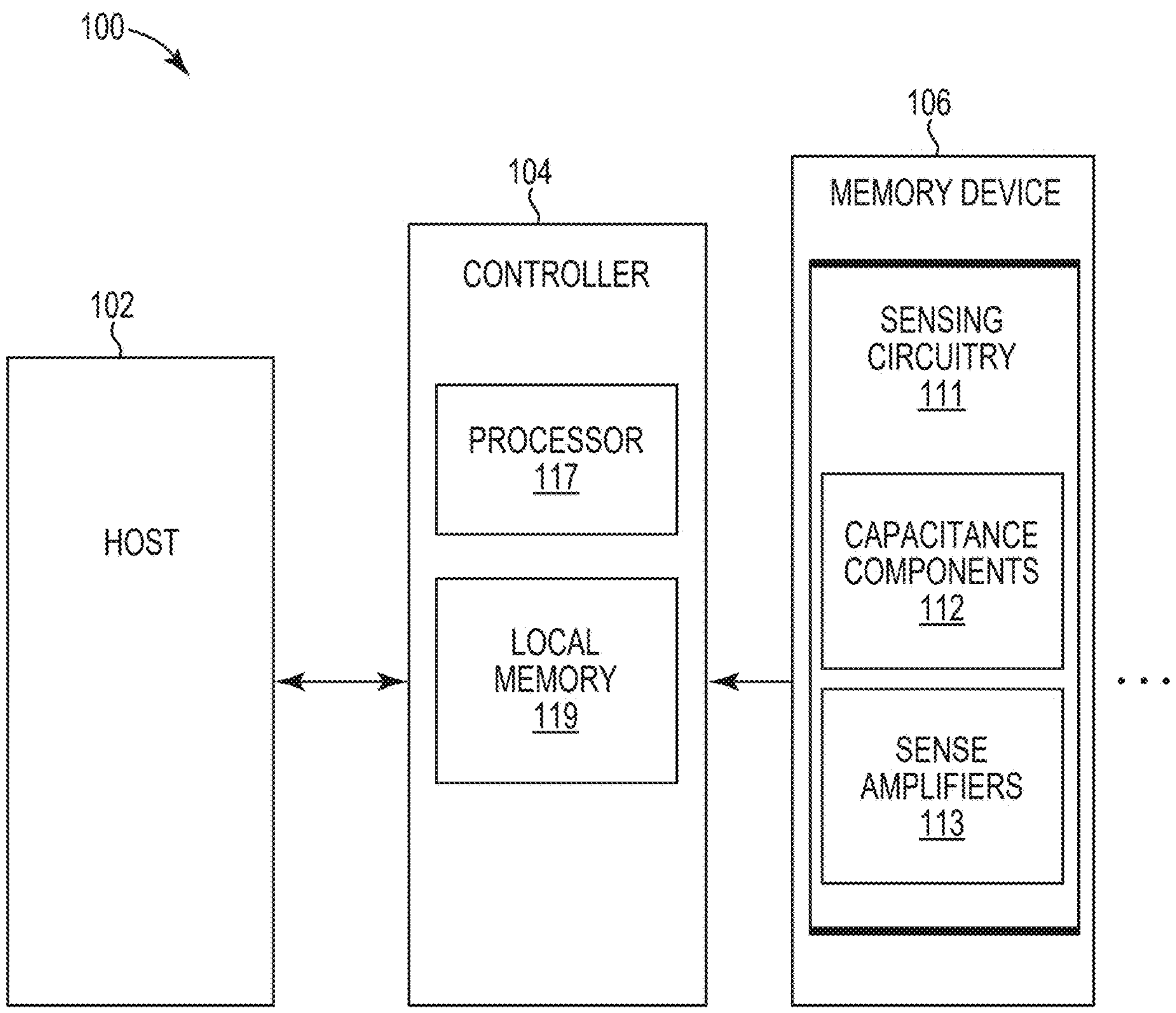
FIG. 1 illustrates an example electronic system that includes a host, a controller, and a device having a sense amp capacitance component in accordance with various embodiments of the present disclosure.

The present disclosure includes apparatuses and methods related to a balancing component (e.g., capacitors, transistors, etc.) utilized to balance a sense amplifier such that, during sensing of a memory cell, a reference digit line has an increased voltage to compensate for any capacitive imbalance with the active digit line (e.g., due to capacitive coupling between the active digit line and the word line and/or capacitive coupling between the memory cell and the active digit line). In various embodiments, the increased voltage on the reference digit line provided by the balancing component can increase a voltage margin associated with sensing a first data state of the memory cell (e.g., a logic "0") while decreasing a voltage margin associated with sensing a second data state of the memory cell (e.g., a logic "1") as compared to sensing of the memory cell without utilizing the balancing component. Accordingly, various embodiments can result in a shifting of the "deadband" of the sense amplifier (e.g., toward an equilibration voltage). Shifting the deadband toward the equilibration voltage can provide benefits such as extending the refresh passing limit of the sense amplifier, which refers to the amount of time a cell can be accurately sensed in the absence of a refresh operation.

As used herein, a sense amp can include a differential sense amp. As used herein, a differential sense amp is a device that is able to sense a voltage difference between two input lines (e.g., digit lines, etc.) and amplify the difference to be utilized by other electrical devices. In a specific example, the sense amp can be an NMOS-PMOS sense amplifier (N-P sense amp), although other differential sense amplifiers can be utilized in a similar way.

In some embodiments, a compensation time can be used in association with balancing the sense amp. Balancing the sense amp can refer to a calibration step to ensure that the sensitivity to voltage on both of the input terminals (e.g., input digit lines, etc.) are equal. In some embodiments, the sense amp can utilize voltage compensation (Vt compensation) to balance the sense amp. In this way, the sense amp is able to identify a first voltage from a first input line the same way as a second voltage from a second input line. This can be important when the first voltage and the second voltage are relatively close or have a difference that is relatively small.

In some embodiments, the sense amp may be relatively balanced prior to activating a cell and/or word line coupled to an active digit line coupled to the sense amp. In some embodiments, activating the cell and/or word line can increase a voltage of the active digit line that imbalances the sense amp after the compensation. In this way, a voltage difference between the reference digit line and the active digit line can exist when the word line and/or cell are activated.

The present disclosure relates to a balancing component that compensates for the imbalance created (e.g., due to capacitive coupling on the active digit line) by activating the word line and/or memory cell coupled to the active digit line as compared to the reference digit line. In various embodiments, the balancing component is referred to as a capacitance component. For example, the reference digit line can include a capacitance component (e.g., a balancing capacitor) coupled thereto that can be coupled higher to increase a voltage of the reference digit line to compensate for the increase in voltage caused by activating the word line and/or memory cell coupled to the active digit line. In this way, the reference digit line and the active digit line coupled to the sense amp can provide a shifted deadband (e.g., more centered) resulting in improved sensing capability in the form of an increased refresh passing limit as compared to prior approaches, for example. Although embodiments are not so limited, the capacitance component can be, for example, a transistor that can be enabled in association with sensing a memory cell in order to provide sense amp balancing functionality.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1 illustrates an example electronic system 100 that includes a host 102, a controller 104, and a memory device 106 in accordance with various embodiments of the present disclosure.

The electronic system 100 can be, or can be part of, for example, a desktop computer, laptop computer, televisions, home theater system, gaming console, digital camera, network router and/or switch, printer, scanner, medical device, GPS navigation device, home device (e.g., thermostat, doorbell camera, security camera, smart lock, etc.), wearable device, industrial control system (e.g., automated industrial and/or control device) mobile computing device, a vehicle (e.g., airplane, drone, train, automobile, or other conveyance), Internet of Things (IoT) enabled device, embedded computer (e.g., one included in a vehicle, industrial equipment, or a networked commercial device), system-on-chip (SoC), chipset (e.g., a collection of integrated circuits), tile, Field-Programmable Gate Array (FPGA) structure (e.g., segmented FPGA structure), or other such device.

The electronic system 100 includes a host 102. The host 102 can include a processor chipset and a software stack executed by the processor chipset. For example, the host 102 can be, or can include, a central processing unit (CPU) or a CPU complex that can be configured to execute an operating system.

The host 102 can be coupled to the controller 104 via a physical and/or logical host interface that operates based on various communication protocols and to provide control, address, data, and other signals to the controller 104 (e.g., to further cause the controller 104 to control the memory device 106). Examples of the interface between the host 102 and the controller 104 can include, but not limited to, a bus interface (e.g., a serial advanced technology attachment (SATA) interface, a Serial Attached SCSI (SAS) interface, a Serial Attached SCSI (SAS) interface, a Small Computer System Interface (SCSI), a peripheral component interconnect express (PCIe) interface, ISA, etc.), a memory interface (e.g., a double data rate (DDR) interface, a dual in-line memory module (DIMM) interface, an Open NAND Flash Interface (ONFI) interface, an NVM Express (NVMe) interface), a Fibre Channel, an UART interface, an I2C interface, a Serial Peripheral Interface (SPI), an Universal Serial Bus (USB) interface, an ethernet interface, a general-purpose input/output (GIPO) interface, a custom interface, etc.

The controller 104 is communicatively coupled to one or more memory devices 106 such that signaling can be exchanged therebetween. Non-limiting examples of the memory devices 106 can include Static Random Access Memory (SRAM) devices, Dynamic Random Access Memory (DRAM) devices, and Flash memory devices. As shown in FIG. 1, the memory device 106 includes sensing circuitry 111 having capacitance components 112, examples of which are described further herein. The sensing circuitry 111 includes a number of sense amplifiers 113 to which the capacitance components 112 are coupled. As described further herein, the capacitance components 112 can serve as sense amp balancing components in association with sensing (e.g., reading) memory cells of memory device 106.

As shown in FIG. 1, the controller 104 can include a processing device (e.g., processor 117) that can execute instructions stored in a local memory 119 to perform various operations described herein. The controller 104 can include various special purpose circuitry in the form of an ASIC, FPGA, state machine, and/or other logic circuitry that can perform operations described herein. As an example, the controller 104 can be a memory controller.

In various embodiments, one or more constituent components (e.g., host 102, controller 104, memory device 106, etc.) of system 100 can be part of a SoC. In one example, a memory device 106 itself can correspond to an SoC, while the host 102 and the controller 104 are considered "external" to the SoC. In another example, the host 102 or the controller 104, or both, can be considered as a part of an SoC along with the memory device 106 being internal or external to the SoC.

Figure 2:
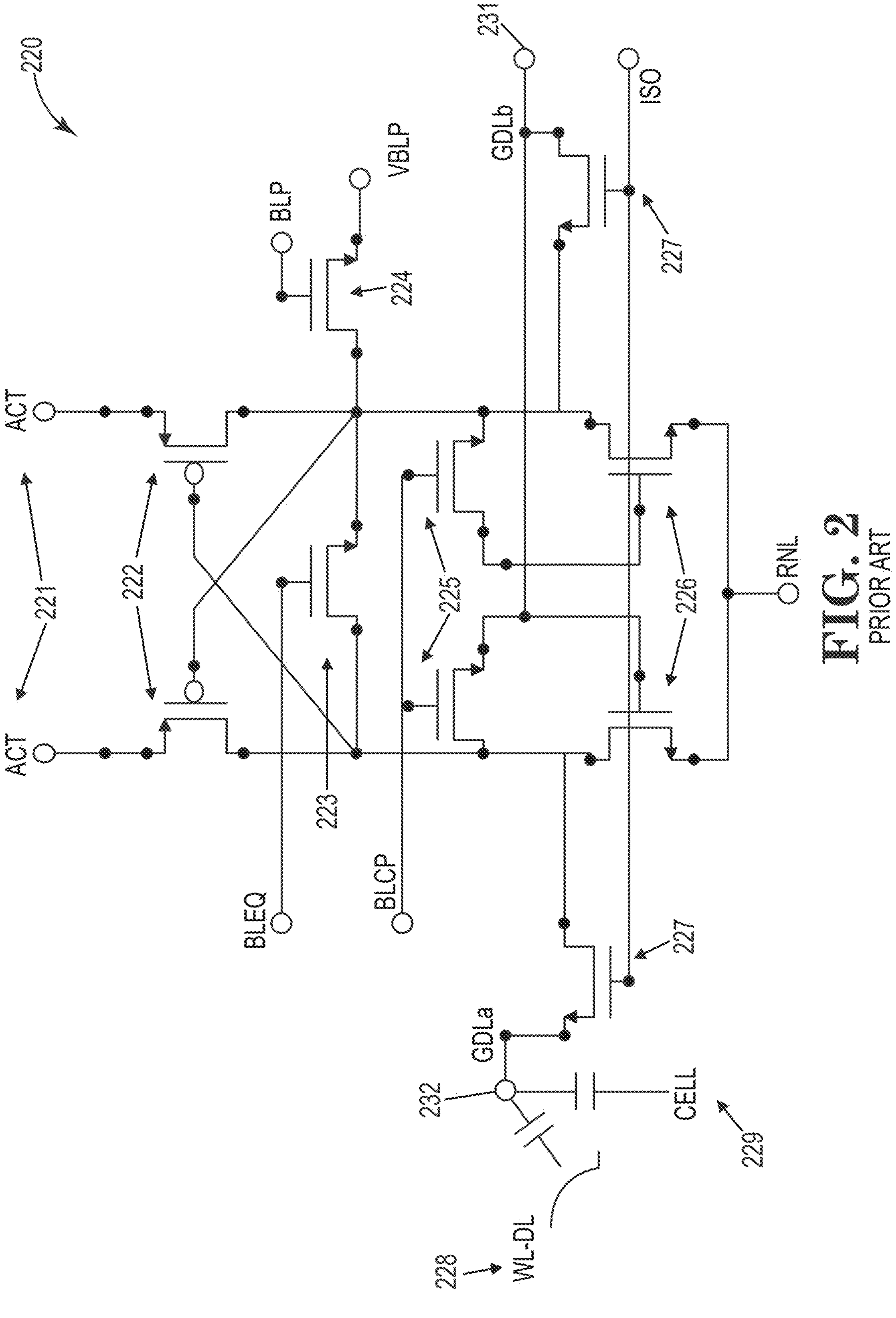
FIG. 2 PRIOR ART
FIG. 2 illustrates an example sense amp that includes a first digit line and a second digit line in accordance with some embodiments of the present disclosure.

FIG. 2 illustrates an example sense amp 220 coupled to a first digit line 231 and a second digit line 232 in accordance with some embodiments of the present disclosure. FIG. 2 illustrates a conventional differential sense amplifier circuit and a pair of complementary digit lines 231 (GDLb) and 232 (GDLa), which may also be referred to as bit lines. As known in the art, when memory cells are accessed, a row of memory cells are activated and sense amplifiers are used to amplify a data state for the respective column of activated memory cells by coupling each of the digit lines of the selected column to voltage supplies such that the digit lines have complementary logic levels.

In this example, the sense amp 220 includes a bit line equalization (BLEQ) transistor 223. The BLEQ transistor 223 can be utilized to equalize or balance the voltages on the digits lines before a read operation commences. The sense amp 220 includes bit line compensation (BLCP) transistors 225. The BLCP transistors 225 can be utilized for setting the bit lines (e.g., 231/232) to a known voltage difference for sense amp imbalance before a read or write operation begins. In some embodiments, the sense amp 220 includes a bit line pre-charge (BLP) transistor 224 to establish the correct voltage conditions on the bit lines before and during memory operations.

When a memory cell 229 is accessed, the voltage of one of the digit lines increases or decreases slightly, depending on whether the memory cell 229 coupled to the active digit line (e.g., 232 in this example) is charged or not, resulting in a voltage difference between the digit lines 231/232. As an example, the memory cell 229 can be a DRAM cell comprising a capacitor and an access transistor whose gate is connected to a word line. The voltage of the digit line coupled to the cell being read increases or decreases slightly (e.g., active digit line), the other digit line serves as a reference. Respective transistors are enabled after the voltage difference is established, thereby driving the slightly higher voltage digit line to a supply voltage and the other digit line to a reference voltage, such as ground, to further drive each of the digit lines in opposite directions and amplify the selected digit line signal depending on the data value stored in the memory cell.

The digit lines are precharged during a precharge period (e.g., compensation window, etc.) to a precharge voltage VBLP, such as one-half of a supply voltage (e.g., Vcc/2, which may be 0.5V), so that a voltage difference can be accurately sensed and amplified on sense nodes during a subsequent sensing operation. However, when a low data state signal from a memory cell 229 is weakly signaled, while P-channel transistors (e.g., transistors 222) of a sense amplifier has a weakness to voltage threshold (Vt) offset, the digit lines may not be amplified to reflect a logic high or low level in a timely fashion, and sensed and amplified levels on sense nodes may not be reflected on local input/output (LIO) nodes while the LIO nodes are coupled to the sense nodes. Such delay in amplification can cause the sense amplifier to erroneously to provide signals in the wrong direction. There is, therefore, a need for a sense amplifier design that timely amplifies the digit lines even for the weak low data state signal from the memory cell 229.

The sense amp 220 consists of a cross-coupled NMOS transistor pair (e.g., transistors 226) forming an N-sense amplifier, and a cross-coupled PMOS transistor pair (e.g., transistors 222) forming a P-sense amplifier. The N-sense-amp common node is labeled RNL. Similarly, the P-sense-amp common node is labeled ACT (for ACTive pull-up).

Since the digit line pair are both initially at Vcc/2 volts, the N-sense-amp transistors are initially off due to zero Vgs potential. Similarly, both P-sense-amp transistors are initially off due to their positive Vgs potential. In these embodiments, a signal voltage develops between the digit line pair when the memory bit access occurs. While one digit line (e.g., digit line 232) contains charge from the cell 229 access, the other digit line (e.g., digit line 231) serves as a reference for the sensing operation. The sense amplifier firing generally occurs sequentially rather than concurrently (e.g., the N-sense-amp fires first and the P-sense-amp fires second).

After the N-sense-amp fires, ACT 221 will be driven toward Vcc volts. This activates the P-sense-amp that operates in a complementary fashion to the N-sense-amp. With the low voltage digit line approaching ground, a strong signal will exist to drive the appropriate PMOS transistor into conduction. This will charge the high voltage digit line toward ACT 221, ultimately reaching Vcc.

In some embodiments, the sense amp 220 includes transistors 227 that can be utilized to selectively enable or disable the connection between the sense amp 220 and the memory cell 229 or a data bus. This ISO signal plays a role in the operation of memory devices by ensuring that the sense amp 220 is engaged at the appropriate times during read and write cycles and isolated (disconnected) when not in use or when their interaction could disrupt the operation of the memory array or corrupt data.

As described further herein, activating the word line coupled to the gate of the access transistor of the memory cell 229 results in capacitive coupling 228 (e.g., WL-DL) between the word line and the active digit line, which can result in an increase to a voltage of the active digit line 232. In this way, the digit line 232 may be out of balance from the digit line 231. The present disclosure utilizes the capacitance components 112 as referenced in FIG. 1, which can be transistors as described further herein, to increase a voltage of the digit line 231 to compensate for the increase in voltage on the digit line 232 due to WL-DL capacitive coupling 228 and/or due to cell capacitance.

Figure 3:
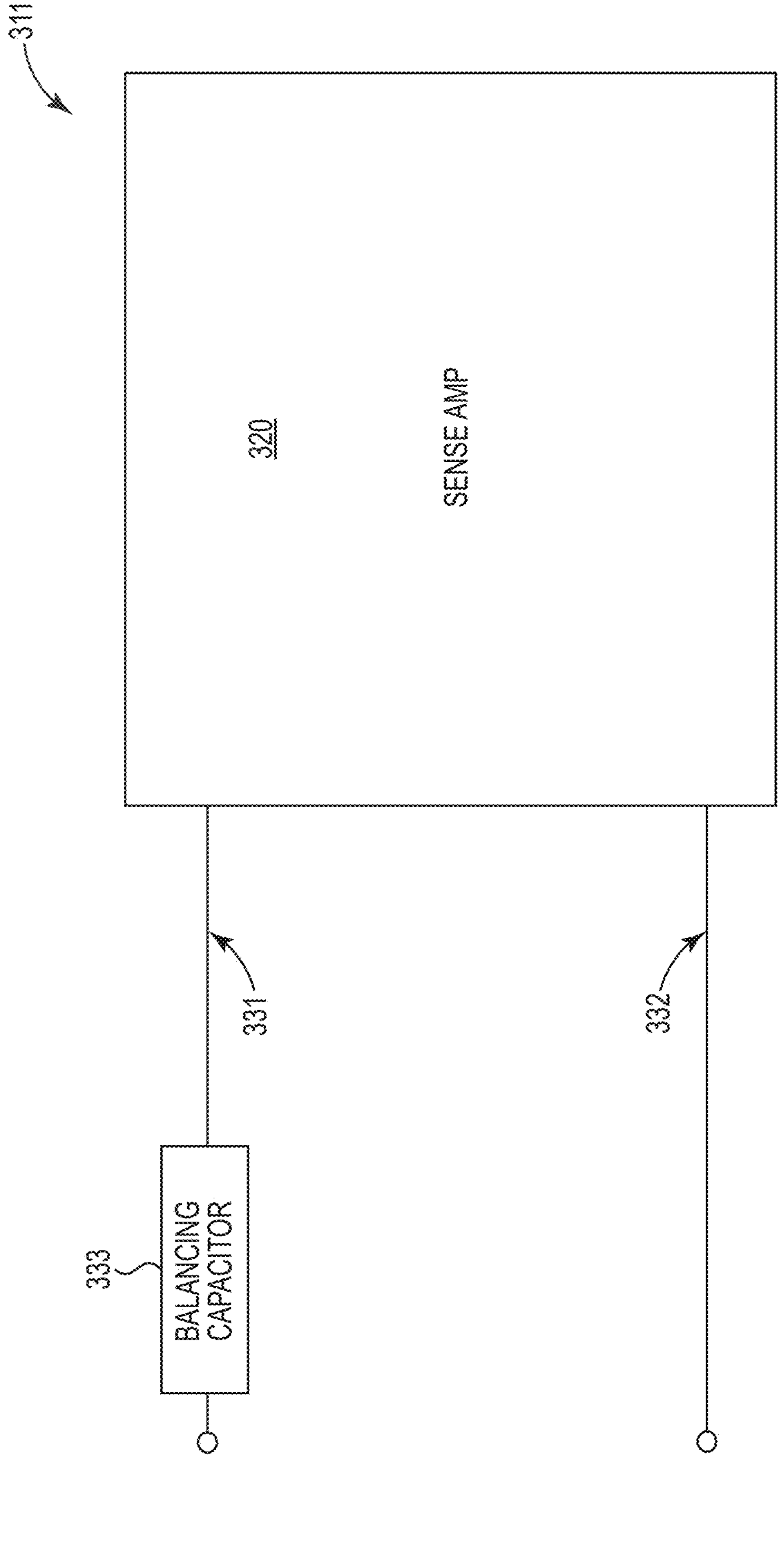
FIG. 3 illustrates an example of sensing circuitry that includes a sense amp that utilizes a capacitance component in accordance with some embodiments of the present disclosure.

FIG. 3 illustrates an example of sensing circuitry 311 that includes a sense amp 320 that utilizes a capacitance component 333 in accordance with some embodiments of the present disclosure. In various embodiments, the sense amp 320 is a differential sense amp. For example, the sense amp 320 can be an N-P sense amp (e.g., sense amp 220 as referenced in FIG. 2, etc.) that includes cross coupled NMOS and PMOS transistor pairs to determine a value of a cell.

As illustrated in FIG. 3, the sense amp 320 is connected to a first digit line 331 and a second digit line 332. In addition, the system 330 can include a capacitance component 333 coupled to the first digit line 331 to increase a voltage of the first digit line 331 when activated in response to completion of a compensation of the sense amp 320. As described herein, the first digit line 331 is a reference digit line and the second digit line 332 is an active digit line. As used herein, the reference digit line can be set to a reference voltage and the active digit line can be connected to a memory cell being read to determine the value of the memory cell (e.g., logic 1 or 0). In this way, the sense amp 320 can determine the value of the memory cell by comparing the voltage difference between the digit lines 331 and 332.

In some embodiments, the capacitance component 333 can be connected to the first digit line 331 when the first digit line 331 is the reference digit line. That is, the capacitance component 333 can be utilized to increase a voltage of the reference digit line of the sense amp 320. In some embodiments, the capacitance component 333 is activated to discharge a voltage to the first digit line 331 in response to completion of a compensation of the sense amp 320. As used herein, a compensation or compensation window of the sense amp 320 can refer to a time period associated with balancing the sense amp 320.

As described herein, operations can be executed during the compensation window to ensure that a voltage sensed at the first digit line 331 and at the second digit line 332 are equal or close to equal (i.e., closer to equal than if the sense amp balancing isn't performed). However, when the word line and/or memory cell coupled to the second digit line 332 are activated, the voltage of the second digit line 332 is increased which results in an imbalance between the first digit line 331 and the second digit line 332. In some embodiments, the capacitance component 333 can be activated upon completion of operations associated with the compensation window to compensate for the increased voltage on the second digit line 332 due to activating the word line and/or memory cell coupled to the second digit line 332. In this way, the first digit line 331 can be increased by a similar voltage as the second digit line 332 is increased as a result of activating the word line and/or memory cell.

In some embodiments, the capacitance component 333 is a transistor that has a source and a drain connected to the first digit line 331. In these embodiments, a gate of the transistor is activated in response to completion of the compensation of the sense amp 320 which will couple the first digit line 331 higher due to the gate capacitance. As described further herein, a transistor can be utilized to couple a higher voltage on the first digit line 331 in response to a memory controller activating a gate of the transistor when the source and the drain of the transistor are connected to the first digit line 331.

As described herein, the voltage from the capacitance component 333 compensates for a word line coupled to the gate of the access transistor of the memory cell that results in capacitive coupling 228 (e.g., WL-DL) between the word line and the active digit line, which can result in an increase to a voltage of the active digit line 232. As described herein, the second digit line 332 can be an active digit line that is coupled to a memory cell and/or word line of a memory device. In these embodiments, the memory cell and/or word line can have a capacitance that when activated can discharge a voltage on the second digit line 332 when the memory cell and/or word line are activated after the compensation window. In this way, the added voltage of the capacitance component 333 provided to the first digit line 331 can compensate for the voltage applied to the second digit line 332 when activating the memory cell and/or word line.

In some embodiments, the capacitance component 333 is activated in response to activating a word line or a cell of a memory device. As described herein, activating the memory cell and/or word line can discharge a capacitance stored by the memory cell and/or word line that provides a voltage on the second digit line 332. In response to activating the word line or cell of the memory device, the capacitance component 333 can be activated to discharge a capacitance stored by the capacitance component 333 to provide a voltage on the first digit line 331.

In some embodiments, the capacitance component 333 increases the voltage of the first digit line 331 to increase a voltage margin of the first digit line 331. In a similar way, the capacitance component 333 increases the voltage of the first digit line 331 results in a decrease of a voltage margin of the second digit line 332. As used herein, the voltage margin of a digit line refers to a difference between an actual detected voltage level that represents a "1" or a "0" and a minimum voltage level required to reliably distinguish between the two states. By increasing the voltage margin of the first digit line 331 or reference digit line, the ability of the sense amp 320 to detect when the state of the memory cell is a "0" can be improved. In contrast, by decreasing the voltage margin of the second digit line 332 or active digit line, the ability of the sense amp 320 to detect when the state of the memory cell is a "1" can be improved.

Even though the decreasing the voltage margin of the second digit line 332 can decrease the ability of the sense amp 320 to detect when the state of the memory cell is a "1", the overall deadband of the sense amp 320 can be better centered with the increase to the ability of the sense amp 320 to detect when the state of the memory cell is a "0". As used herein, the trip point of the sense amp 320 refers to a region (e.g., voltage range) within which the sense amplifier does not distinctly differentiate between a logical "0" and a "1". The deadband of the sense amp 320 is further illustrated in reference to FIG. 7.

In various instances, a voltage of a memory cell can "leak" over a period of time, which can affect the ability to clearly distinguish a stored "1" versus a stored "0." As used herein, memory cell "leakage" refers to an unintentional loss of electrical charge from a memory cell (e.g. a storage capacitor) in a semiconductor device, such as those found in Static Random-Access Memory (SRAM), Dynamic Random-Access Memory (DRAM), etc. In this way, a particular memory cell that is storing a logical "0" may "leak" towards the logical state of "1" and a memory cell that is storing a logical "1" may "leak" towards the logical state of "0".

In various instances, the deadband of the sense amp 320 can be skewed toward 0V such that "leakage" from the logical state of "0" towards the logical state of "1" enters the deadband relatively faster than "leakage" from the logical state of "1" to the logical state of "0". For this reason, it can be beneficial to increase the voltage margin for detecting the "0," for example, in order to shift the deadband upward (e.g., toward a more central voltage level). In this way, shifting the deadband to a more central voltage (e.g., closer to Vcc/2) can increase the likelihood of accurately sensing a cell's stored value by increasing the likelihood of accurately sensing a "0" even though it is decreasing the likelihood of accurately sensing a "1" to some degree. For example, increasing the deadband voltage window can increase the amount of time it takes for a stored value of "0" to reach the deadband while decreasing the amount of time takes before a stored value of "1" will "leak" to the deadband. However, the overall ability for the sense amp 320 to accurately sense the cell is improved as the overall retention time (e.g., refresh passing limit) is increased.

Figure 4:
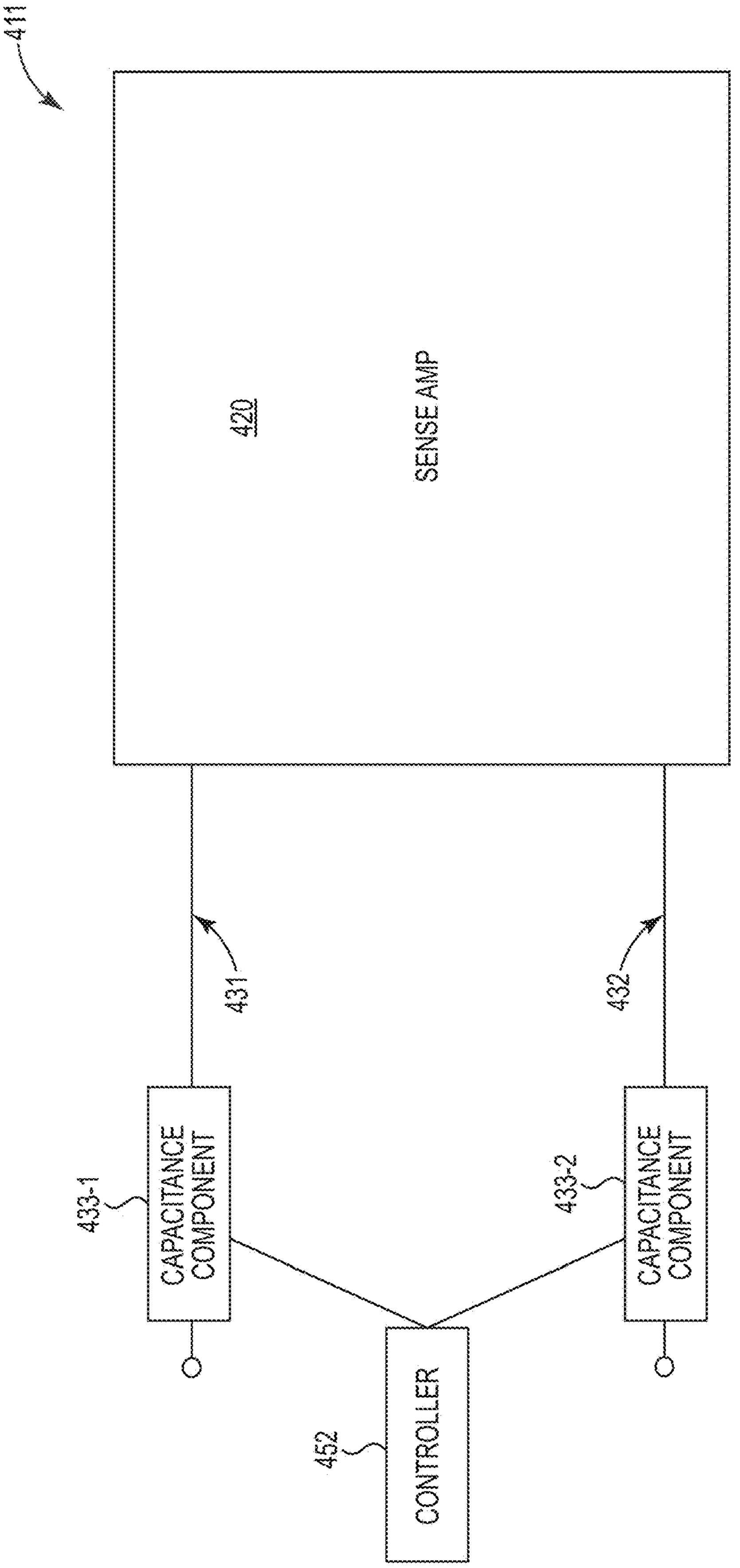
FIG. 4 illustrates an example of sensing circuitry that includes a sense amp that utilizes a capacitance component in accordance with some embodiments of the present disclosure.

FIG. 4 illustrates an example of sensing circuitry 411 that includes a sense amp 420 that utilizes a capacitance component 433-1, 433-2 in accordance with some embodiments of the present disclosure.

In some embodiments, the sensing circuitry 411 includes a sense amp 420 coupled to a first digit line 431 and a second digit line 432. In these embodiments, the sensing circuitry 411 includes a capacitance component 433-1 coupled to the digit line 431 to increase a voltage of the digit line 431 when activated. In some embodiments, the digit line 431 is a reference digit line. However, in some embodiments, a reference digit line and an active digit line of the sense amp 420 can switch. That is, the reference digit line can switch from the digit line 431 to the digit line 432 and the active digit line can switch from the digit line 432 to the digit line 431.

In these embodiments, the sensing circuitry 411 includes a capacitance component 433-2 coupled to the digit line 432 to increase a voltage of the digit line 432 when activated. As described herein, the capacitance component 433-1 can be a first transistor that includes a first source coupled to the digit line 431 and a first drain coupled to the digit line 431. In these embodiments, the capacitance component 433-2 can be a second transistor that includes a second source coupled to the digit line 432 and a second drain coupled to the digit line 432.

In some embodiments, sensing circuitry 411 can include a multiplexor coupled to the controller 452, a first gate of the first transistor, and a second gate of the second transistor. In these embodiments, the multiplexor can be configured to allow the controller 452 to provide signals to a first gate of the first transistor and provide signals to a second gate of the second transistor. For example, the controller 452 can utilize a multiplexor that can allow the controller 452 to provide a signal to a first gate of the capacitance component 433-1 and/or provide a signal to a second gate of the capacitance component 433-2. Providing the signal to a gate of a capacitance component (e.g., capacitance component 433-1, capacitance component 433-2) can activate or deactivate the corresponding capacitance capacitor. In this way, the controller 452 can determine which digit line is a reference digit line and activate a corresponding capacitance component coupled to the reference digit line.

In some embodiments, the sensing circuitry 411 includes a controller 452 configured to identify the digit line 431 as a reference digit line and the digit line 432 as an active digit line. As described herein, the digit line 431 can be the reference digit line and the digit line 432 can be the active digit line. However, the active digit line and the reference digit line can be switched in some embodiments. For this reason, the controller 452 cand identify the reference digit line and provide a signal to the corresponding capacitance capacitor.

In some embodiments, the sensing circuitry 411 includes a controller 452 configured to activate the capacitance component 433-1 in response to activating a word line associated with the digit line 432. As described herein, activating the word line associated with the second digit line 432 can discharge a capacitance associated with the word line and increase a voltage on the digit line 432. In other embodiments, a memory cell coupled to the second digit line 432 can be activated and a capacitance of the memory cell can be discharged to increase a voltage on the second digit line 432. In this way, the capacitance component 433-1 can be activated in response to activating the word line and/or memory cell associated with the second digit line 432 to compensate for the added voltage discharged by the word line and/or memory cell.

In some embodiments, the controller 452 is configured to prevent the second capacitance component 433-2 from being activated in response to identifying the second digit line 432 as the active digit line. As described herein, only the capacitance component coupled to the reference digit line is activated. Activating the capacitance component coupled to the active digit line would discount the added voltage applied to the reference digit line since the active digit line already has an increased voltage from the discharged capacitance associated with activating the word line and/or memory cell coupled to the active digit line.

In some embodiments, the controller 452 is configured to deactivate the capacitance component 433-1 prior to activating the sense amp 420. In these embodiments, the controller 452 is configured to deactivate the capacitance component 433-1 in response to a determination that a threshold voltage has been provided to the digit line 431 by the first capacitance component 433-1. As described herein, the controller 452 can be utilized to activate or discharge the first capacitance component 433-1 to increase a voltage on the digit line 431. Increasing the voltage on the digit line 431 can be utilized to compensate for a voltage increase due to activating the word line and/or memory cell associated with the second digit line 432.

In these embodiments, the controller 452 can limit the voltage increase applied by the first capacitance component 433-1 to compensate for activating the word line and/or memory cell associated with the digit line 432 while not exceeding a threshold voltage. In some embodiments, the threshold voltage can be based on a potential voltage increase caused by activating the word line and/or memory cell associated with the digit line 432. In this way, the voltage of the first digit line 431 does not exceed a voltage that can negatively affect the deadband of the sense amp 420.

Figure 5:
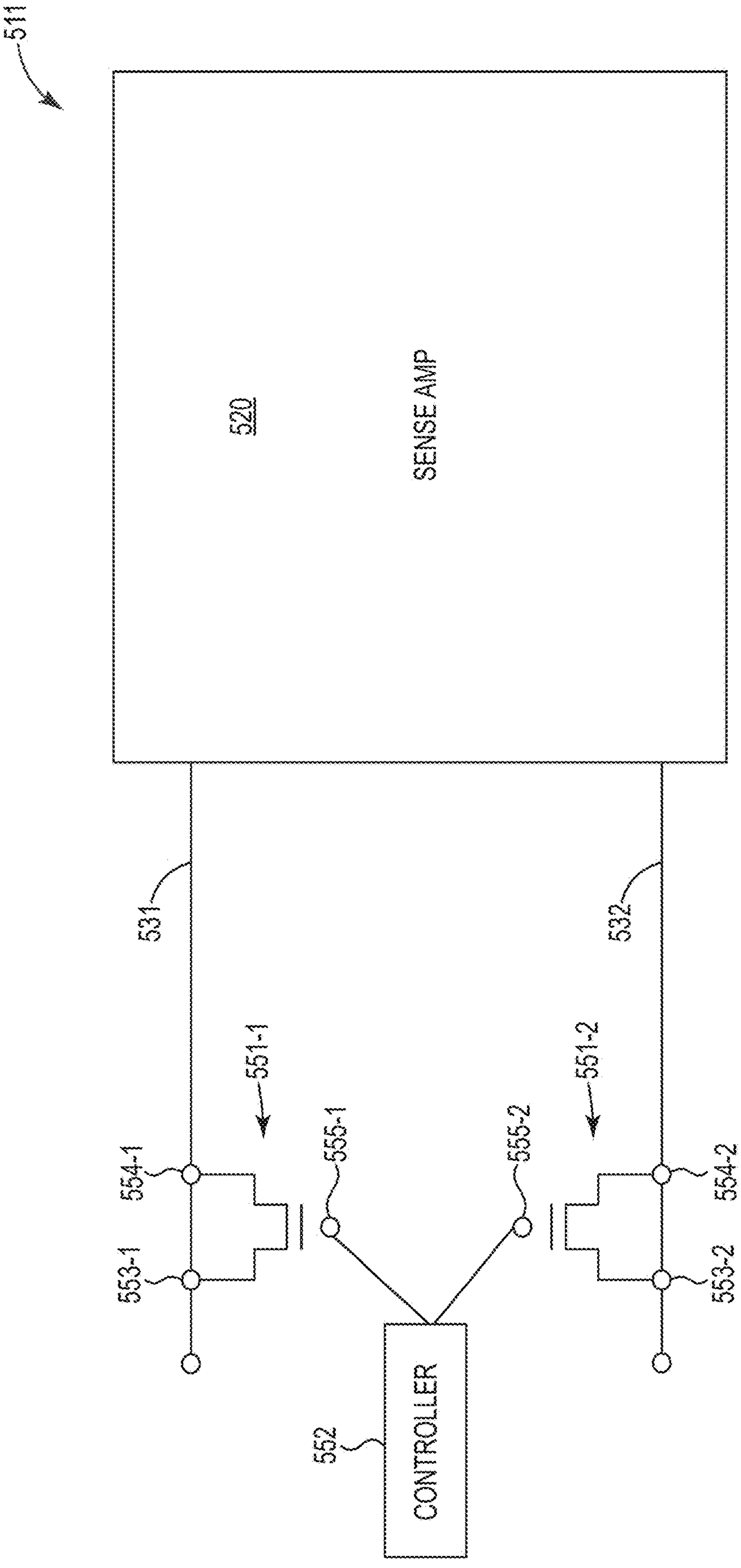
FIG. 5 illustrates an example of sensing circuitry that includes a sense amp that utilizes a capacitance component in accordance with some embodiments of the present disclosure.

FIG. 5 illustrates an example of a sensing circuitry 511 that includes a sense amp 520 that utilizes a transistor (e.g., transistor 551-1, transistor 551-2, etc.) as a capacitance component in accordance with some embodiments of the present disclosure.

In some embodiments, the sensing circuitry 511 includes a transistor 551-1 that includes a source 554-1 coupled to the digit line 531 of the sense amp 520 and a drain 553-1 coupled to the digit line 531 of the sense amp 520. In a similar way, the sensing circuitry 511 includes a transistor 551-2 that includes a source 554-2 coupled to the digit line 532 of the sense amp 520 and a drain 553-2 coupled to the digit line 532 of the sense amp 520.

In some embodiments, the sensing circuitry 511 includes a controller 552 coupled to a multiplexor that can connect the controller 552 to a gate 555-1 of the transistor 551-1 and connect the controller 552 to a gate 555-2 of the transistor 551-2. In these embodiments, the controller 552 is capable of providing a signal to the gate 555-1 of the transistor 551-1 and/or the gate 555-2 of the transistor 551-2. As described herein, the controller 552 can identify which digit line from the digit line 531 and the digit line 532 is the reference digit line. In these embodiments, the controller 552 can activate a gate of a corresponding transistor coupled to the reference digit line in response to a word line and/or memory cell coupled to the active digit line being activated.

Upon activating the gate of the transistor coupled to the reference digit line, the capacitance of the transistor is discharged to increase a voltage of the reference digit line. For example, the controller 552 can activate the gate 555-1 when the digit line 531 is the reference digit line and a word line and/or memory cell coupled to the second digit line 532 is activated. In this example, the capacitance from the transistor 551-1 can be discharged at the source 554-1 and/or the drain 553-1 to increase a voltage of the digit line 531.

In some embodiments, the controller 552 can determine when the digit line 531 has increased to a threshold voltage. In these embodiments, the controller 552 can send a signal to the gate 555-1 of the transistor 551-1 to stop discharging the capacitance to stop increasing the voltage of the digit line 531. In this way, the digit line 531 can be increased by a particular voltage to compensate for a voltage increase on the digit line 532 from activating the word line and/or memory cell associated with the digit line 532.

In some embodiments, the controller 552 can prevent the transistor 551-2 from being activated when the digit line 532 is identified as the active digit line. As described herein, the active digit line and reference digit line can be switched and thus the controller 552 can be utilized to identify the reference digit line and only activate the transistor coupled to the reference digit line.

Figure 6:
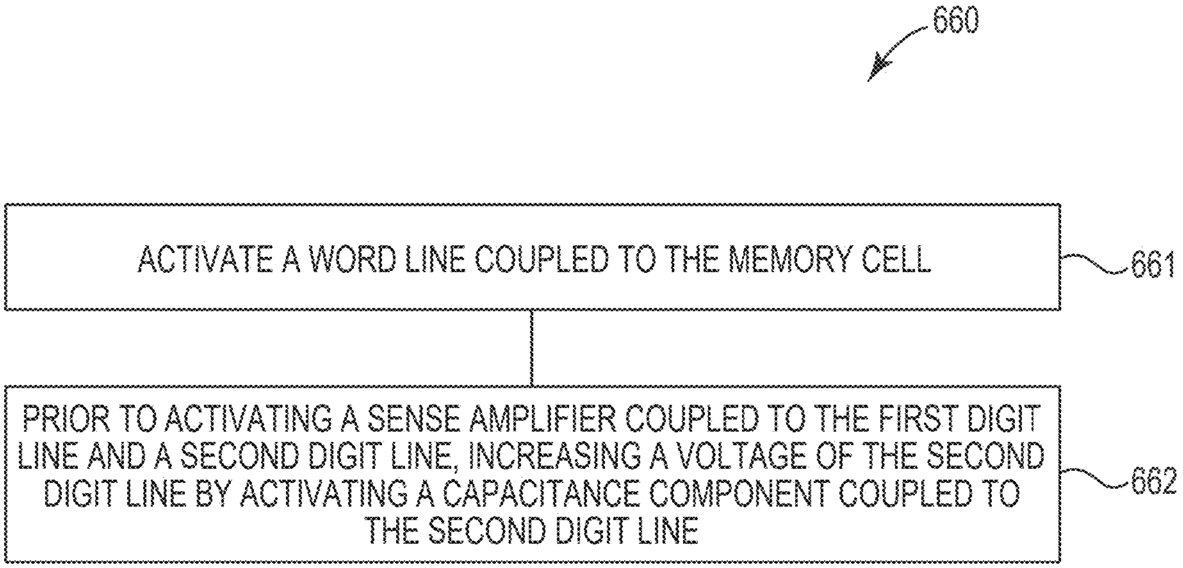
FIG. 6 is a flow diagram corresponding to a method for balancing a sense amp in accordance with some embodiments of the present disclosure.

FIG. 6 is a flow diagram corresponding to a method 660 for balancing a sense amp in accordance with some embodiments of the present disclosure. The method 660 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 660 is performed by the capacitance components 112 (e.g., transistor, balancing component, etc.) of FIG. 1. In some embodiments, the method 660 can be executed utilizing a system or apparatus such as system 550 as referenced in FIG. 5.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, the method 660 can be executed to perform a pre-charge operation. As described herein, the digit lines are precharged during a precharge period to a precharge voltage, such as one-half of a supply voltage (e.g., Vcc/2, which may be 0.5V), so that a voltage difference can be accurately sensed and amplified on sense nodes during a subsequent sensing operation.

In some embodiments, the method 660 can be executed to perform a compensation of a sense amp that is coupled to a first digit line and a second digit line. As described herein, a compensation (e.g., during a compensation window, etc.) of the sense amp can refer to a process that ensures that the sense amp is equally sensitive to voltage (or current) variations on both of its input terminals or digit lines. This balance can be crucial for accurate, reliable, and fast detection of the stored data value from the minuscule voltage differences between the bit lines during a read operation. Once the sense amp is balanced, a word line and/or memory cell can be activated to perform a memory operation. As described herein, activating the word line and/or memory cell can discharge a capacitance associated with the word line and/or memory cell, which can increase a voltage of the active digit line, which can unbalance the sense amp.

The method 660 can be executed to identify the first digit line as a reference digit line and the second digit line as an active digit line. As described herein, the reference digit line serves as a comparison standard for the sense amplifier. It does not directly interact with any specific memory cell during a read operation. Instead, it holds a reference voltage or current that is used to compare against the signal on the active digit line. As described herein, the active digit line (also known as the active bit line in some contexts) carries the signal corresponding to the actual data stored in the memory cell being accessed. When a memory cell is read, the state of that cell (representing either a logical '0' or '1') affects the voltage level on the active digit line. In this way, the voltage of the active digit line can be compared to the voltage of the reference digit line.

The method 660 can be executed at step 661 to activate a word line coupled to the memory cell. As described herein, activating the word line coupled to the memory cell can discharge a voltage on to the active digit line of the sense amp. This can create an imbalance between the reference digit line and the active digit line after compensation.

The method 660 can be executed at step 662 to increase a voltage of the second digit line by activating a capacitance component coupled to the second digit line prior to activating a sense amplifier coupled to the first digit line and a second digit line. In these embodiments, increasing the voltage of the second digit to compensate for a capacitive coupling occurring on the first digit due at least to capacitive coupling between the memory cell and the first digit line and to capacitive coupling between the word line and the first digit line.

In some embodiments, the method 660 can be executed to activate a capacitance component coupled to the first digit line to increase a voltage of the first digit line. As described herein, the capacitance component can be activated to discharge a capacitance of the capacitance component to increase the voltage of the first digit line when the first digit line is a reference digit line. In these embodiments, the voltage increase of the first digit line can be utilized to compensate for the voltage increase on the second digit line caused by the capacitance of the word line and/or memory cell coupled to the second digit line.

In some embodiments, the method 660 can include activating the capacitance component by activating a gate of a transistor that includes a source and a drain coupled to the first digit line. As described herein, the capacitance component can be a transistor that can be activated by a controller to discharge the capacitance of the transistor, which can increase the voltage on the first digit line.

The method 660 can be executed to activate a word line coupled to the second digit line. As described herein, activating the word line coupled to the second digit line can discharge a capacitance of the word line, which can increase a voltage of the second digit line. For example, the word line can act as a capacitor and drain on to the second digit line when activated.

The method 660 can be executed to deactivate the capacitance component prior to activating the sense amp. As described herein, a controller can be utilized to deactivate the capacitance component when a particular quantity of voltage is provided to the first digit line. In this way, the controller can determine when the voltage increase of the first digit line has compensated for the voltage increase on the second digit line caused by activating the word line and/or activating the memory cell and deactivate the capacitance component prior to activating the sense amp for use in performing the memory operation (e.g., read operation, etc.).

In some embodiments, the method 660 can include determining when a threshold voltage has been provided to the first digit line and activating the sense amp in response to determining the threshold voltage has been provided to the first digit line by the capacitance capacitor. As described herein, once the threshold voltage is provided to the first digit line, the controller can activate the sense amp to perform a particular memory operation. In this way, the sense amp can be further balanced after activating the word line and/or memory cell coupled to the active digit line.

Figure 7:
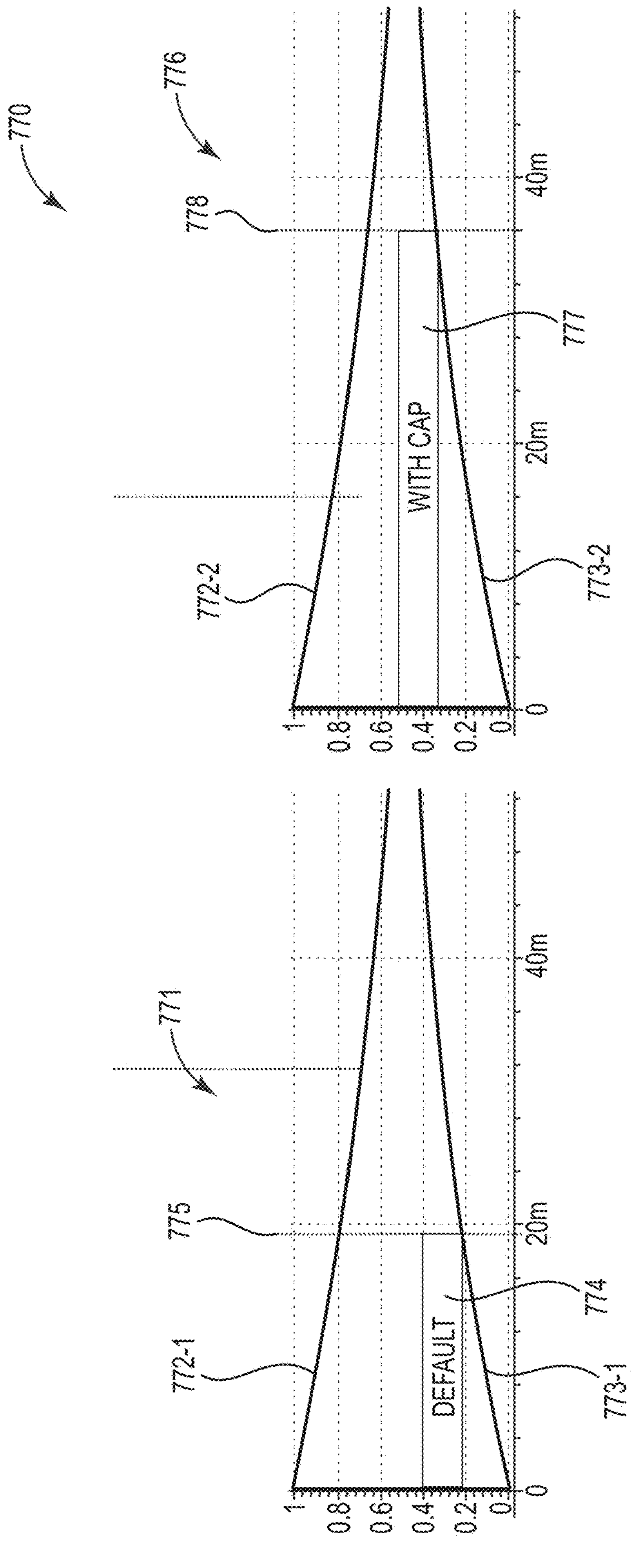
FIG. 7 is a graph diagram illustrating a deadband caused by different charge leakage of memory cells associated with some embodiments of the present disclosure.

FIG. 7 is a graph diagram 770 illustrating a deadband caused by different charge leakage of memory cells associated with some embodiments of the present disclosure. The graph diagram 770 illustrates a default leakage graph 771 and a capacitance component leakage graph 776. The default leakage graph 771 illustrates a default deadband 774 and the capacitance component leakage graph illustrates a capacitance component deadband 777.

As described herein, the deadband can refer to a point (e.g., voltage window) at which a sense amp is unable to accurately sense the cell. That is, the sense amp is unable to accurately determine if the stored value of the cell is a "1" or a "0". In graph 771, line 772-1 represents voltage leakage from a high voltage (e.g., a Vcc voltage of 1V) representing a stored logic value of "1," and line 773-1 represents a voltage leakage from a low voltage (e.g., 0V) representing a stored logic "0." As used herein, line 772-1 can be referred to as the "high leakage," and line 773-1 can be referred to as the "low leakage."

The default deadband 774 can include a voltage range where the sense amp is not able to accurately sense the stored value. In this way, the memory cell is not able to be read when either the high leakage 772-1 or the low leakage 773-1 enters the range of voltages represented by the default deadband 774. In a specific example, the deadband voltage range can be between 0.2 V and 0.4 V. In this embodiment, the default deadband 774 is crossed by the low leakage 773-1 at the time 775 (e.g., 20 milliseconds, etc.). In these embodiments, the default deadband 774 can be crossed by the low shift 773-1 prior to being crossed by the high shift 772-1. However, the cell is not accurately sensed by the sense amp when either the low shift 773-1 or the high shift 772-1 cross the default deadband 774.

As described herein, shifting the deadband toward the equilibration voltage (e.g., 0.5 V as illustrated by the default leakage graph 771 and the capacitance component leakage graph 776) can provide benefits such as extending the refresh passing limit of the sense amplifier, which refers to the amount of time a cell can be accurately sensed in the absence of a refresh operation. As described herein, the voltage of the reference digit line can be increased by the capacitance component (e.g., transistor, etc.) coupled to the reference digit line. In this way, the capacitance component deadband 777 of the capacitance component leakage graph 776 is shifted toward the equilibration voltage. For example, the range of voltages for the capacitance component deadband 777 is between 0.4 V and 0.6 V.

In these embodiments, the capacitance component deadband 777 extends to the time 778, which is greater than the time 775 as illustrated in the default leakage graph 771. In these embodiments, the leakage of the cell is the same between the default leakage graph 771 and the capacitance component leakage graph 776. For example, the high shift 772-1 and the low shift 773-1 can be the same as the high shift 772-2 and the low shift 773-1. However, it can take longer for the low shift 773-2 to enter the capacitance component deadband 777 than it took for the low shift 773-1 to enter the default deadband 774.

In this way, the high shift 772-2 is going to reach the capacitance component deadband 777 faster than the high shift 772-1 will reach the default deadband 774, but since the low shift 773-2 remains the limiting factor for the memory cell to be accurately sensed, the detriment to the high shift 772-2 will still allow the cell utilizing the capacitance component to be accurately sensed for a greater quantity of time (e.g., time 778 instead of time 775, etc.).

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMS, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An apparatus, comprising:

a sense amplifier connected to a first digit line and a second digit line; and a capacitance component coupled to the first digit line and configured to, in association with sensing a memory cell connected to the second digit line, be enabled, via a controller, to increase a voltage of the first digit line to compensate for capacitive coupling corresponding to the second digit line, wherein the controller is configured to;

activate the capacitance component coupled to the first digit line in response to the memory cell associated with the second digit line being accessed; and deactivate the capacitance component in response to a determination that a threshold voltage has been provided to the first digit line.

2. The apparatus of claim 1, wherein the first digit line is a reference digit line and the second digit line is an active digit line in association with sensing the memory cell.

3. The apparatus of claim 1, wherein the capacitance component is a transistor with a source and a drain coupled to the first digit line of the sense amplifier.

4. The apparatus of claim 1, wherein the capacitance component is configured to compensate for a capacitive imbalance created by activating a memory cell connected to a second digit line.

5. The apparatus of claim 1, wherein the capacitive coupling corresponding to the second digit line includes:

capacitive coupling between the memory cell and the second digit line; and capacitive coupling between the second digit line and a word line to which the memory cell is connected.

6. The apparatus of claim 1, wherein the sense amplifier is a differential sense amplifier.

7. The apparatus of claim 1, wherein enabling the capacitance component increases a voltage margin associated with sensing a first data state of the memory cell and decreases a voltage margin associated with sensing a second data state of the memory cell.

8. The apparatus of claim 7, wherein the capacitance component is a first capacitance component, and wherein the apparatus includes a second capacitance component coupled to the second digit line and configured to sense a memory cell to which the second digit line is connected.

9. The apparatus of claim 1, wherein the threshold voltage is based on a potential voltage increase caused by activating the memory cell associated with the second digit line.

10. An apparatus, comprising:

a sense amplifier connected to a first digit line and a second digit line;

a first capacitance component coupled to the first digit line;

a second capacitance component coupled to the second digit line; and a controller coupled to a first gate of the first capacitance component and a second gate of the second capacitance component, configured to:

in association with sensing a memory cell connected to the second digit line, activate the first capacitance component thereby increasing a voltage of the first digit line;

deactivate the first capacitance component in response to determining a first threshold voltage is provided to the first digit line;

in association with sensing a memory cell connected to the first digit line, activate the second capacitance component thereby increasing a voltage of the second digit line; and deactivate the second capacitance component in response to determining a second threshold voltage is provided to the second digit line.

11. The apparatus of claim 10, wherein the controller is configured to:

maintain the second capacitance component in a deactivated state when sensing the memory cell connected to the second digit line; and maintain the first capacitance component in a deactivated state when sensing the memory cell connected to the first digit line.

12. The apparatus of claim 10, wherein at least one of the first capacitance component and the second capacitance component is a transistor having its source and drain commonly coupled to its corresponding digit line.

13. The apparatus of claim 12, wherein the first capacitance component is a first transistor having its source and drain commonly coupled to the first digit line, and the second capacitance component is a second transistor having its source and drain commonly coupled to the second digit line.

14. The apparatus of claim 10, wherein the controller is configured to activate the first capacitance component in response to the first digit line being equilibrated to a reference voltage.

15. The apparatus of claim 10, wherein the controller is configured to activate the second capacitance component in response to the second digit line being equilibrated to a reference voltage.

16. The apparatus of claim 10, wherein the controller is configured to activate the first capacitance component by activating a first gate of the first capacitance component and activate the second capacitance component by activating a second gate of the second capacitance component.

17. A method for sensing a memory cell, comprising:

activating a word line connected to the memory cell, wherein the memory cell is connected to a first digit line; and prior to activating a sense amplifier connected to the first digit line and a second digit line, increasing a voltage of the second digit line by activating, via a controller, a capacitance component coupled to the second digit line; and deactivating, via the controller, the capacitance component in response to determining a threshold voltage is provided to the second digit line, wherein increasing the voltage of the second digit line by the threshold voltage compensates for a capacitive coupling occurring on the first digit line due at least to capacitive coupling between the memory cell and the first digit line and to capacitive coupling between the word line and the first digit line.

18. The method of claim 17, wherein the capacitance component is a transistor whose source and drain are commonly coupled to the second digit line, and wherein the method includes providing an enable signal to a gate of the transistor to activate the capacitance component.

19. The method of claim 17, further comprising activating the capacitance component in response to completing a compensation of the first digit line and the second digit line.

20. The method of claim 19, further comprising activating the capacitance component in response to activating the memory cell or the word line.

* * * * *